March 7, 1961 R. S. LACKEY ET AL 2,973,627

THERMOELECTRIC HEAT PUMP

Filed June 29, 1959 2 Sheets-Sheet 1

INVENTORS
ROBERT S. LACKEY
JACK D. MEESS
BY William J. Foley
ATTORNEY

March 7, 1961 R. S. LACKEY ET AL 2,973,627

THERMOELECTRIC HEAT PUMP

Filed June 29, 1959 2 Sheets-Sheet 2

INVENTORS
ROBERT S. LACKEY
JACK D. MEESS
BY William J. Foley
ATTORNEY 2,973,627

THERMOELECTRIC HEAT PUMP

Robert S. Lackey and Jack D. Meess, Pittsburgh, Pa., assignors to Westinghouse Electric Corporation, East Pittsburgh, Pa., a corporation of Pennsylvania Filed June 29, 1959, Ser. No. 823,620

9 Claims. (Cl. 62—3)

This invention relates to thermoelectric heat pumps and particularly to an improved structure for heat pumps which are adapted for use in domestic refrigeration.

Thermoelectric heat pumps employing the Peltier phenomenon of heat absorption and heat dissipation at a current carrying junction between two materials having dissimilar thermoelectric properties generally employ an array of a multiplicity of thermocouples, or junctions. The number of thermoelectric elements, or bodies, employed in the arrays is often quite large and their size is quite small; for example, a thermoelectric array for pumping heat from a compartment having a volume of the order of three or four cubic feet may use 100 or more thermoelectric bodies of a quarter of an inch in diameter and one-half inch or less in length. Moreover, thermoelectric materials currently available and preferred for regrigeration applications are formed of semi-conductor type materials, such as bismuth telluride, which are fragile, that is, subject to breakage when subjected to bending or shear stresses.

The problem of supporting and electrically connecting this large number of fragile thermoelectric bodies is one that has confronted designers of thermoelectric heat pumps for a considerable period. The present invention has for its principal object the provision of a structural arrangement for thermoelectric heat pumps which assures reliable and safe support for the individual elements of the thermoelectric array and which can be achieved in a practical, low-cost and efficient manner.

The principal feature of this invention resides in a novel hot junction structure for the heat pump. As can be readily understood, the heat dissipated from the hot junction side of a thermoelectric array is considerably in excess of the heat absorbed at the cold junction side of the array because, in addition to the heat absorbed at the cold junction side, the Joule heat generated in the array must be dissipated from the hot junction side. Most present day thermoelectric arrays operate with high electrical currents, with the result that the Joule heat losses in the system often exceed the quantity of heat absorbed at the cold junction side of the array.

The present invention recognizes this ratio of heat absorbed to heat dissipated and utilizes the large heat dissipating structure on the hot junction side of the heat pump as the load (i.e. weight) bearing structure for the components of the heat pump. The cold junction structure of the thermoelectric array, which is called upon to conduct a lesser amount of heat and can therefore be made of lighter construction, is carried and supported by the more massive and stronger hot junction structure.

More specifically, this invention envisions a thermoelectric array in which a plurality of rigid heat dissipating members rigidly join pairs of elongated rod-like conducting members which are joined to the hot ends of the thermoelectric bodies and form hot junctions therewith. Each heat dissipating member and the conducting rods joined thereto form a rigid, large surface, junction structure through which heat is conducted away from the hot junction ends of the thermoelectric bodies and which provides structural support for the bodies.

It is contemplated that the hot junction structures be attached to a rigid plate of heat insulating material which serves as the central structural element of the entire heat pump assembly. This insulating plate is perforated so that the conducting rods of the hot junction structure can project through the plate. The heat dissipating members are located adjacent one face of the plate and the thermoelectric bodies are disposed beyond, or in spaced relationship with, the other or opposite face of the plate. The heat dissipating members of the hot junction structures are clamped against the insulating plate by a clamping sheet which is preferably made of heat conducting material so that it can supplement the heat dissipating function of the members. Securement of the clamping sheet is effected by connecting means extending between the clamping sheet and the insulating plate.

The clamping sheet serves the additional function of defining with the insulating plate an air duct, or passage, through which cooling air is confined to flow over the heat dissipating members of the hot junction structures.

In accordance with the invention, the heat absorbing structure of the heat pump is supported from this same insulating plate which is an integral part of the hot junction supporting assembly. The arrangement is such that the heat absorbing structure is held in good heat transfer relationship with the cold junction portion of the thermoelectric array, and its weight is not imposed upon the thermoelectric bodies but rather is referred back to the insulating plate.

Other features, objects and advantages of this invention will appear from the following detailed description thereof wherein reference is made to the accompanying drawings forming a part hereof and wherein.

Figure 1:
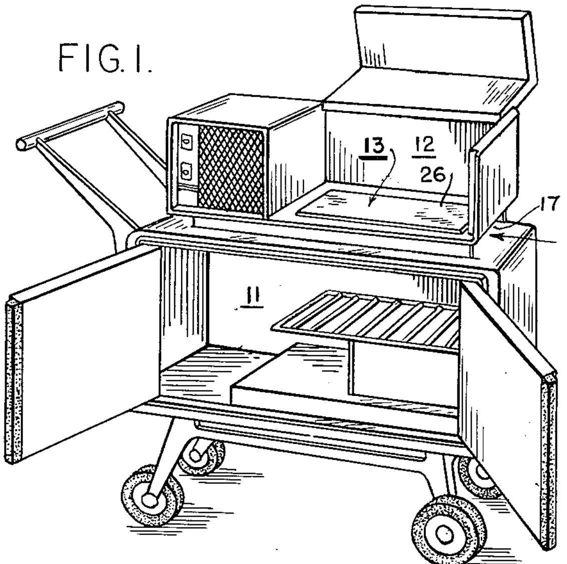
Fig. 1 is a perspective illustration of a serving cart appliance employing the thermoelectric heat pump of this invention.

The serving cart illustrated in Fig. 1 is an example of one type of novel appliance to which the thermoelectric heat pump of this invention is applicable. This cart is employed to transport and maintain in palatable condition both chilled and warmed foods. It includes a cooling compartment 11 and a warming compartment 12 and utilizes a thermoelectric heat pump 13 for pumping heat from the cooling compartment into the warming compartment. A self-contained source of electrical current is preferably provided in the cart, as indicated at 15, for energizing the heat pump 13 independently of the electrical supply system of the building or home in which the cart is used. The novel serving cart is described in greater detail and is claimed in the copending application of Royal S. Buchanan, Serial No. 813,220, filed May 14, 1959, now abandoned, and assigned to the same assignee as this invention.

The present invention is directed specifically to the construction of the heat pump 13. Thus, while the invention is applicable to the serving cart in connection with which it is herein described, it is to be understood that the principles and features of the invention are applicable to heat pumps employed in other appliances such as, for example, domestic refrigerators.

The heat pump 13 is disposed in aligned openings in adjacent walls of the cooling compartment 11 and warming compartment 12 in such a manner that its heat absorbing structure 14 is disposed in the cooling compartment 11 and a heat dissipating region 16 thereof is disposed partially within the warming compartment 12 and partially within an air duct 17 between the two compartments. When energized, the heat pump absorbs heat from the cooling compartment 11 and pumps heat into the warming compartment 12. That heat which must be dissipated from the heat pump which is in excess of the heat required to maintain the warming compartment 12 at the desired temperature is dissipated to surrounding air, which is circulated through the duct 17 by means of a blower 18 located in the upper portion of the serving cart.

Figure 4:
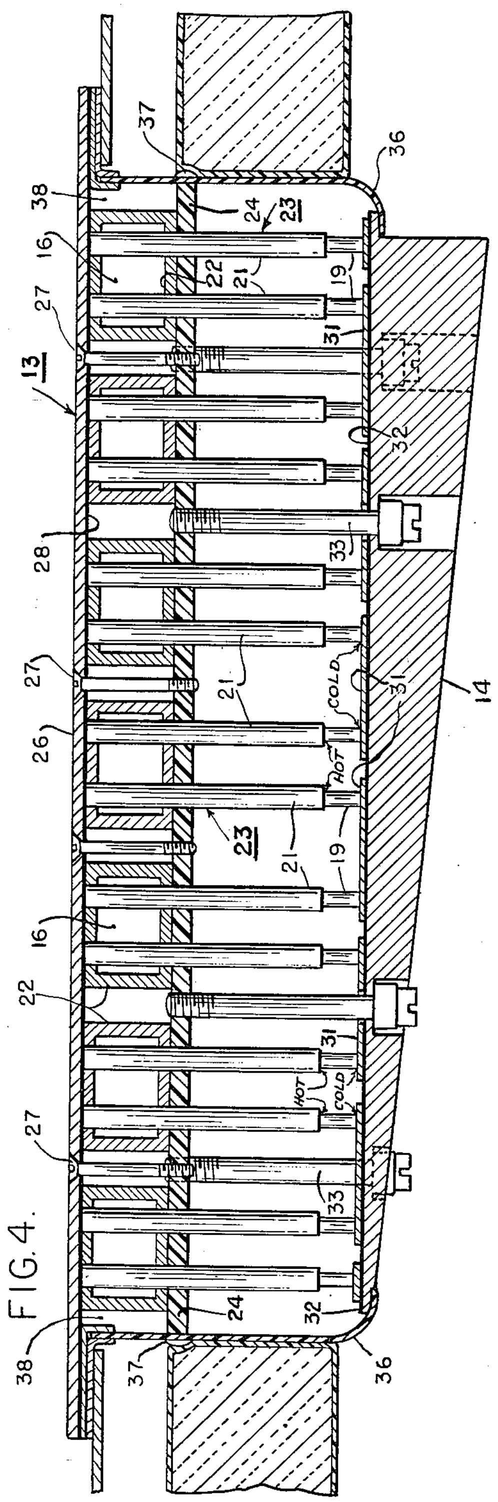
Fig. 4 is a sectional view in elevation through the heat pump.
Figure 6:
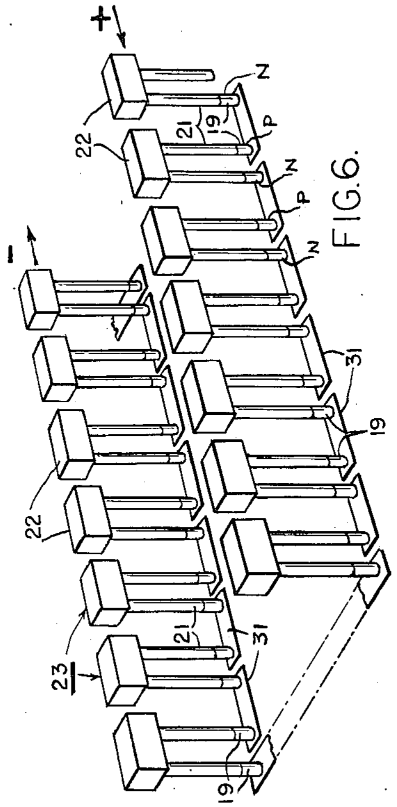
Figure 5:
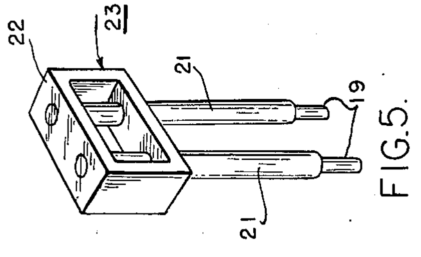
Fig. 5 is a perspective illustration of the novel hot junction structure of the invention; and, Fig. 6 is a fragmentary, schematic illustration of the thermoelectric array, which shows the electric current path through the elements of the array.

Referring particularly to Figs. 4 through 6 wherein the details of the heat pump 13 are illustrated, the transfer of heat from the heat absorbing structure 14 to the heat dissipating region 16 is effected by a plurality of thermoelectric bodies, or elements, 19, which are connected as thermocouples in a thermoelectric array. These bodies 19 are arranged in an orderly pattern within the heat pump 13 in the vicinity of the heat absorbing structure 14 and are alternately formed from two materials having dissimilar thermoelectric properties. These bodies may be formed, for example, from N and P type bismuth telluride, or from bismuth and antimony. As is well understood, the passage of direct electric current through a junction of two such dissimilar thermoelectric materials from an N type material to a P type material causes heat to be absorbed at the junction. The passage of current in the reverse direction between such elements causes heat to be released at the junction. For an established arrangement of bodies 19 in a thermoelectric array and with a given direction of current flow it can be said that the bodies possess hot junction ends and cold junction ends. In accordance with this invention, all of the bodies 19 have their hot junction ends joined to a corresponding number of conducting rods, or rod-like members, 21. Each body 19 is joined to a rod member 21 in a manner, such as by soldering or brazing, to provide minimum resistance to the flow of heat and electric current between the body and its rod member.

The rod members 21 are preferably made from a material such as copper, which has good heat conducting properties and good electrical conducting properties, because these members, in addition to conducting electrical current to the thermoelectric bodies 19, also conduct heat away from the hot junction ends of the bodies to the heat dissipating region 16 of the heat pump. The opposite ends of each pair of rod members 21 are connected by a heat dissipating means in the form of a hollow rectangular member 22. There are a plurality of heat dissipating members 22, each of which connects a pair of conducting rods 21.

The heat dissipating members 22 are formed of a good heat conducting material, such as copper or aluminum, and are preferably shaped so as to provide extended surface area for dissipation of heat to air flowing thereover. The hollow rectangular configuration of the members 22 shown in the drawings possesses the desirable extended surface area and, in addition, imparts rigidity to the heat dissipating member to enable the member to rigidly connect and support the conducting rods 21 which are inserted into openings provided therefor in the upper and lower legs of the member. The joints between the conducting rods 21 and the heat dissipating members 22 are preferably filled by brazing or welding these pieces together to improve the flow of heat from the rods 21 to the heat dissipating member 22 and to reduce the electrical resistance of the joint.

Each pair of thermoelectric bodies 19, the pair of conducting rods 21 joined thereto, and the dissipating member 22 joining the pair of rods can and will be collectively referred to as a hot junction structure 23. The several hot junction structures 23 are carried by a rigid plate 24 of a material that has good heat insulating and good electrical insulating qualities. A plate formed from fabric reinforced resin is considered to be particularly suitable for this application although other materials may be employed. The plate 24 is perforated in an orderly manner to receive the conducting rods 21 of the hot junction structures 23. It will be noted that, when the structures are assembled on the plate 24 as shown in Fig. 4, the conducting rods 21 extend entirely through the plate and the thermoelectric bodies 19 and the heat dissipating members 22 are disposed on opposite sides of the plate. The several hot junction structures 23 are secured to the plate 24 by means of a clamping sheet, or plate, 26, which is bolted as indicated at 27 or otherwise securedly fastened to plate 24. It is to be noted that the heat dissipating members 22 are clamped between the insulating plate 24 and the clamping sheet 26, which abuts against the upper ends of the conducting rods 21. Sheet 26 is perferably made of a good heat conducting material, such as aluminum or steel, because it conducts heat into the warming compartment 12 of the cart. In effect, then, the clamping sheet 26 functions as a part of the heat dissipating portion of the heat pump 13. Inasmuch as a metallic clamping sheet will conduct electric current, it must be insulated from the hot junction structures 22 in order to prevent shorting of the thermoelectric array. For this purpose, the underside of the clamping sheet 26 may be coated with a non-conductive enamel layer 28, or a thin sheet of electrical insulation may be inserted between the clamping sheet and the hot junction structures 23.

The thermoelectric array, which is illustrated schematically in Fig. 6, is completed by a plurality of conducting plates or strips 31 which connect the cold junction ends of dissimilar thermoelectric bodies 19 of adjacent pairs of bodies. These plates 31 are preferably made of copper and are joined to the thermoelectric bodies 19 by brazing or soldering in order to provide for the flow of heat to the bodies 19 and for the flow of heat to the bodies 19 and for the flow of electric current between the connected pairs. Conducting plates 31 abut against the heat absorbing structure 14 but are insulated therefrom by means of a thin layer of electrical insulation 32, which may take the form of a coating for the upper surface of the heat absorbing structure, or a separate sheet of insulating material interposed between the heat absorbed structure and the conducting plates 31.

In accordance with this invention, the heat absorbing structure 14, which is merely a block or plate of aluminum or other good heat conducting material, is supported from the rigid insulating plate 24 in such a manner that the weight thereof is not imposed upon the thermoelectric elements 19. As best shown in Fig. 4, the structure 14 is coupled to the plate 24 by means of heat insulating bolts 33, which are threaded into tapped openings in the plate 24. The bolts 33 are made from heat insulating material to reduce the flow of heat from the hot, or upper, side of the heat pump to the cold, or lower, side of the pump in opposition to the flow of heat pumped by the thermoelectric bodies 19. Plastic material, such as nylon, is suitable for making the bolts 33.

Figure 3:
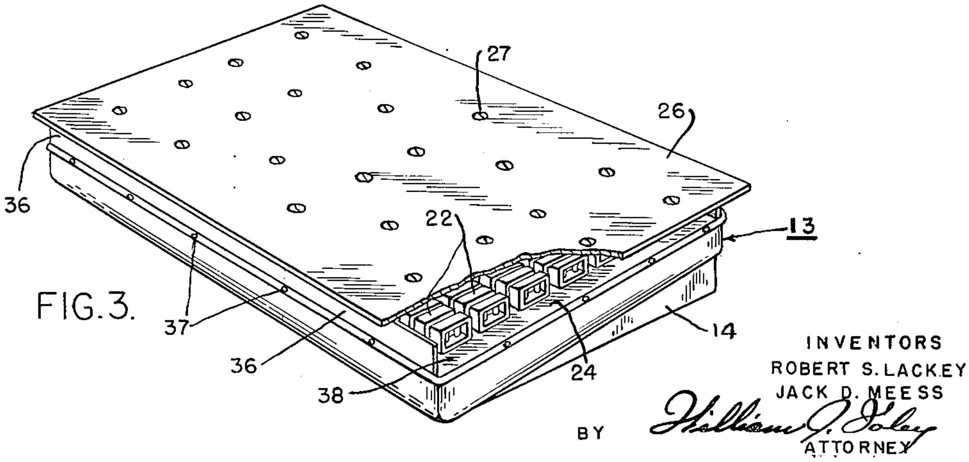
Fig. 3 is a perspective illustration of the heat pump with portions broken away to illustrate the heat dissipating region of the heat pump.

The vertical sides of the heat pump are enclosed by a casing 36 formed of sheet plastic or other material having good heat insulating properties. This casing extends from the heat absorbing structure 14 to the clamping sheet 26 and is preferably held in place by means of screw fasteners 37 threaded into the edge of the insulating plate 24. The casing 36 has openings 38 in opposite end walls thereof (see Fig. 3) between the insulating plate 24 and the clamping sheet 26 for the purpose of permitting air to flow through the heat dissipating region 16 of the heat pump to carry away heat from the heat dissipating members 22 and the exposed end portions of conducting rods 21.

That space between the insulating plate 24 and the heat absorbing structure 14 which is not occupied by the thermoelectric bodies 19 and the conducting rods 21 may, if desired, be filled with insulating material for reducing heat leakage between the hot and cold elements of the heat pump. In the interest of simplifying the drawing, this insulation is not shown, but any suitable material, such as silica aerojel, may be poured into the interior of the heat pump after it is fabricated. Suitable openings (not shown) may be provided in the casing 36 for this purpose.

The above described heat pump structure is believed to possess numerous advantages over prior structures designed for a similar purpose. The principal feature of the invention, of course, resides in the utilization of the heat dissipating structure, i.e., the hot junction structures 23, for supporting the thermoelectric bodies 19. In some prior heat pumps, there has been an attempt made to support the elements of the assembly from the cold junction side of the thermoelectric array. The present invention produces a more economical structure, as well as a more reliable structure, because the supporting function is performed by the hot side elements which generally are of larger mass and have greater surface area, because they must conduct and dissipate large quantities of heat, and are therefore better capable of providing the necessary load-carrying structure. Unusually light, i.e., thin, material can be used in constructing the cold junction plates 31 because these members carry no structural load to speak of, and their size is determined entirely by the quantities of heat and electric current which they are required to conduct.

The utilization of a rigid insulating plate (plate 24) as the central structural element of the heat pump assembly produces another advantage for the present heat pump not found in prior heat pumps. It is to be noted that the thermoelectric array, which is composed of the cold junction plates 31, the thermoelectric bodies 19, their heat conducting rods 21, and the heat dissipating members 22, is maintained under compressive forces exerted through the heat absorbing structure 14 and the clamping sheet 26. These two last named elements are drawn toward each other by separate fastening, or connecting, means which engage the insulating plate 24. The thermoelectric bodies are, therefore, subjected solely to mild compressive forces which they are capable of withstanding without breakage and the clamping arrangement is such as to minimize heat flow from the hot side to the cold side of the heat pump.

Figure 2:
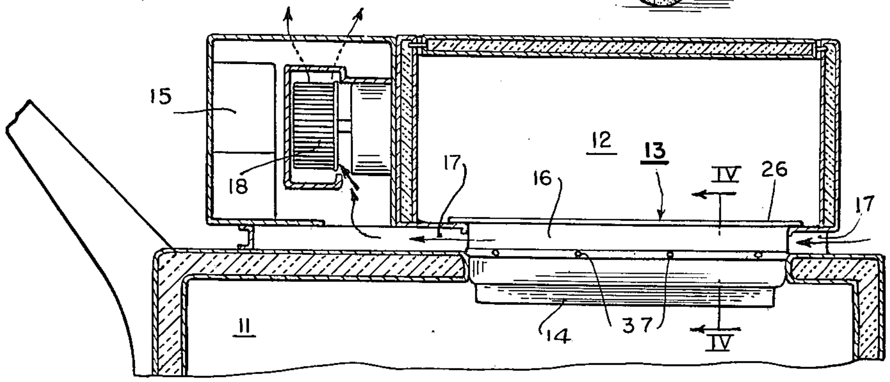
Fig. 2 is a vertical sectional view of the upper portion of the serving cart shown in Fig. 1 and illustrating the disposition of the heat pump in the cart.

The cooling air duct provided by the spaced arrangement of the insulating plate 24 and the clamping sheet 26 constitutes a novel arrangement for dissipating heat from a thermoelectric heat pump. While the heat pump herein shown and described is positioned in a horizontal attitude, it should be obvious that the structural arrangement is such as to permit the heat pump to be utilized in a vertical attitude, such as it might assume when used to pump heat through a vertical wall of an insulated cabinet for a domestic refrigerator or the like. The disposition of the heat pump with respect to such wall would be identical with that illustrated in Figs. 2 and 4 of the drawing, in which the insulating plate 24 is substantially coplanar with the exterior surface of the insulated wall of the cooling compartment 11. In such position, the entire heat dissipating region 16 of the heat pump is disposed exteriorly of the insulated compartment in a position to dissipate heat to the surrounding air.

It should be obvious that the hot junction structure illustrated in Fig. 5 could be produced in quantity with automatic machinery, thereby effecting considerable economy in the manufacture of the heat pump. Any number of such structures can be assembled into a heat pump assembly of practically any size and capacity in accordance with the teachings of this invention.

While the invention has been described with reference to but a single embodiment thereof, it will be obvious to those skilled in the art that it is not so limited, but is susceptible of various changes and modifications without departing from the spirit thereof.

What is claimed is:

1. A hot junction structure for thermoelectric heat pumps comprising a pair of bodies formed of dissimilar thermoelectric materials having hot and cold junction ends, a pair of conducting rods having adjacent ends thereof joined respectively to the hot ends of said bodies, a rigid heat dissipating member providing an extended heat transfer surface, said member being joined to the other ends of said rods and supporting said rods and said bodies, a rigid plate formed of heat insulating material and having perforations therein, and means clamping said member to one face of said plate in such a manner that said rods project through said plate and beyond the opposite face of the plate.

2. A hot junction structure for thermoelectric heat pumps comprising a pair of bodies formed of dissimilar thermoelectric materials having hot and cold junction ends, a pair of conducting rods having adjacent ends thereof joined respectively to the hot ends of said bodies, a rigid heat dissipating member providing an extended heat transfer surface, said member being joined to the other ends of said rods and supporting said rods and said bodies, a rigid plate formed of heat insulating material and having perforations therein, said member being disposed in engagement with one face of said plate in such a manner that said rods project through and beyond said plate, a sheet of heat conducting material, and means securing said sheet to said plate for clamping said member between said plate and said sheet.

3. In thermoelectric heat pump apparatus, a heat insulating plate, a rigid heat dissipating member formed of conductive material, means for supporting said member on said plate, a pair of conductive rods secured to said member and supported thereby, said rods extending through said plate, a pair of bodies of dissimilar thermoelectric material having hot and cold junction ends, said bodies having their hot ends mounted respectively on the ends of said rods and supported thereby, thin plates of conductive material secured to the cold ends of said bodies, a heat absorbing structure, and means for supporting said structure on said insulating plate in thermal transfer relation with said conductive plates.

4. In thermoelectric heat pump apparatus, a pair of spaced parallel plates providing a heat dissipating air duct therebetween, one of said plates being formed of heat insulating material, a heat conducting structure having a portion thereof clamped between said plates and a pair of rod-like extensions projecting through said insulating plate and terminating on the opposite side thereof, and a pair of bodies of dissimilar thermoelectric material having hot and cold junction ends, said bodies having their hot ends mounted respectively on the ends of said extensions and supported thereby.

5. Thermoelectric heat pump apparatus comprising a rigid plate of heat insulating material having a plurality of perforations therein, a plurality of rods of heat conducting material disposed in said perforations and projecting from opposite sides of said plate, heat dissipating means disposed on one side of said plate and rigidly connecting adjacent rods into pairs, a plurality of bodies mounted on the ends of said rods on the other side of said plate, said bodies being alternately formed of two materials having dissimilar thermoelectric properties, each having hot and cold junction ends, the hot junction ends of all of said bodies being joined to said rods and there being a body of each said material joined respectively to the rods of each of said pairs of rods, conducting means connecting the cold junction ends of adjacent dissimilar bodies, a heat absorbing structure, means connecting said heat absorbing structure and said plate for supporting said structure from said plate in abutting relationship with said conducting means, a clamping sheet, and means connecting said clamping sheet and said heat insulating plate for supporting said clamping sheet on said plate in abutting relationship with said heat dissipating means.

6. In a thermoelectric heat pump, a heat absorbing structure, a heat dissipating structure, a rigid plate of heat insulating material disposed between said structures, a thermoelectric array carried by said plate for pumping heat from one structure to the other, said array comprising a plurality of bodies alternately formed of two materials having dissimilar thermoelectric properties, said bodies being disposed between said heat absorbing structure and said plate, conducting members joined to one end of each of said bodies and forming therewith hot thermoelectric junctions, said members projecting through said plate and abutting said heat dissipating structure, and other conducting members connecting the opposite ends of adjacent dissimilar bodies and forming cold junctions therewith, said other conducting members being disposed in abutting relationship with said heat absorbing structure, and securing means extending between said heat absorbing structure and said plate and between said heat dissipating structure and said plate for clamping said array between said structures.

7. In a thermoelectric heat pump, a heat absorbing structure, a clamping sheet, a rigid plate of heat insulating material disposed between said structure and said sheet, a thermoelectric array carried by said plate for pumping heat from one structure to the other, said array comprising a plurality of bodies alternately formed of two materials having dissimilar thermoelectric properties, said bodies being disposed between said heat absorbing structure and said plate, conducting members joined to one end of each of said bodies and forming therewith hot thermoelectric junctions, said members projecting through said plate and abutting said sheet, other conducting members connecting the opposite ends of adjacent dissimilar bodies and forming cold junctions therewith, said other conducting members being disposed in abutting relationship with said heat absorbing structure, securing means extending between said heat absorbing structure and said plate and between said clamping sheet and said plate for clamping said array between said structure and said sheet, and a heat insulating casing surrounding the periphery of said plate and extending between said structure and said sheet, said casing having openings in opposite side walls portions thereof between said sheet and said plate permitting circulation of air over the portions of said heat conducting members which are disposed between said sheet and said plate.

8. In a thermoelectric heat pump, a perforated, rigid plate of heat insulating material, a clamping sheet disposed in spaced, parallel relation to said plate and providing a fluid flow passage therebetween, a heat conducting structure disposed between said plate and said sheet, means connecting said plate and said sheet for clamping said heat conducting structure between the plate and the sheet, thermoelectric bodies alternately formed of dissimilar thermoelectric materials, said bodies possessing hot and cold junction ends when electric current is passed therethrough, said bodies each having one end thereof electrically and thermally connected to said structure and having the opposite ends thereof disposed in spaced relationship to the face of said plate which is opposite said structure.

9. In a thermoelectric heat pump, a perforated, rigid plate of heat insulating material, a clamping sheet disposed in spaced, parallel relation to said plate and providing an air passage therebetween, a heat conducting structure disposed between said plate and said sheet, means connecting said plate and said sheet for clamping said heat conducting structure between the plate and the sheet, said conducting structure having portions thereof projecting into the perforations in said plate, thermoelectric bodies alternately formed of dissimilar thermoelectric materials, said bodies possessing hot and cold junction ends when electric current is passed therethrough, said bodies each having one end thereof electrically and thermally connected to said projecting portions of said structure and having the opposite ends thereof disposed in spaced relationship to the face of said plate which is opposite said structure.

References Cited in the file of this patent

UNITED STATES PATENTS 2,289,152 Telkes ---------------- July 7, 1942
2,844,638 Lindenblad ------------ July 22, 1958
2,903,857 Lindenblad ------------ Sept. 15, 1959